United States Patent [19]
Okano et al.

[11] Patent Number: 6,101,708
[45] Date of Patent: Aug. 15, 2000

[54] METHOD FOR ELECTRICALLY CONNECTING TERMINALS TO EACH OTHER

[75] Inventors: Akihiko Okano, Iruma; Terutaka Okano, Tokorozawa, both of Japan

[73] Assignee: Citizen Watch Co., Ltd., Tokyo, Japan

[21] Appl. No.: 08/859,258

[22] Filed: May 20, 1997

Related U.S. Application Data

[62] Division of application No. 08/403,779, filed as application No. PCT/JP94/01240, Jul. 27, 1994, Pat. No. 5,679,928.

[30] Foreign Application Priority Data

Jul. 27, 1993 [JP] Japan ................................ 5-204658

[51] Int. Cl.[7] ............................................ H05K 3/30
[52] U.S. Cl. ...................... 29/832; 29/840; 228/180.22
[58] Field of Search ............................ 29/825, 830, 852, 29/827, 832, 840, 846; 228/180.21, 180.22

[56] References Cited

U.S. PATENT DOCUMENTS

| | | |
|---|---|---|
| 4,696,764 | 9/1987 | Yamazaki . |
| 4,814,040 | 3/1989 | Ozawa ................................ 29/846 X |
| 5,031,308 | 7/1991 | Yamashita et al. . |
| 5,084,211 | 1/1992 | Kawaguchi et al. . |
| 5,122,215 | 6/1992 | Shibata et al. . |
| 5,147,084 | 9/1992 | Behun et al. . |
| 5,155,301 | 10/1992 | Mase . |
| 5,225,966 | 7/1993 | Basavanhally et al. . |
| 5,235,741 | 8/1993 | Mase .......................................... 29/830 |
| 5,328,087 | 7/1994 | Nelson et al. ......................... 29/830 X |

FOREIGN PATENT DOCUMENTS

| | | |
|---|---|---|
| 0 330 452 A3 | 8/1989 | European Pat. Off. . |
| 5053129 | 3/1993 | Japan . |
| 2 255 219 | 10/1992 | United Kingdom . |

*Primary Examiner*—Carl J. Arbes
*Attorney, Agent, or Firm*—Finnegan, Henderson, Farabow, Garrett & Dunner, L.L.P.

[57] ABSTRACT

A connection terminal portion of a substrate and a terminal portion of an external circuit substrate or a terminal portion of a part are electrically connected together using an anisotropic electrically conducting film. A structure in which a first substrate having a connection terminal portion and a second substrate having a connection terminal portion or a connection terminal portion of a part are connected together with an anisotropic electrically conducting adhesive containing electrically conducting particles, wherein the thickness of the electrically conducting film provided for the connection terminal of the first substrate, the second substrate or the part is smaller than the diameter of the electrically conducting particles. The invention is further concerned with a method of accomplishing the electrical connection.

3 Claims, 8 Drawing Sheets

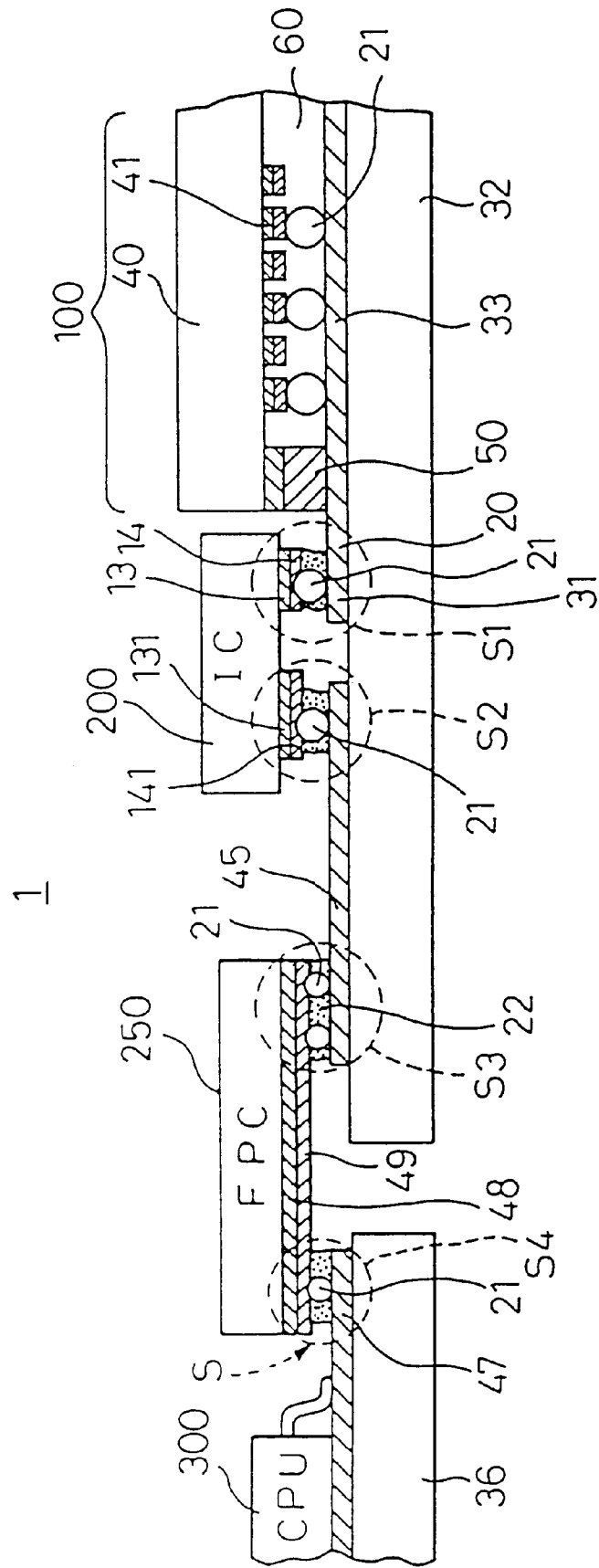

METHOD FOR ELECTRICALLY CONNECTING TERMINALS TO EACH OTHER

This is a division of application Ser. No. 08/403,779, filed Mar. 24, 1995, which is a 371 of PCT/JP 94/01240 filed Jul. 27, 1994 now U.S. Pat. No. 5,679,928.

BACKGROUND OF THE INVENTION

1. Field of the Invention

The present invention relates to an electrically connecting structure and a method of electric connection. More specifically, the invention relates to an electrical connection using an electrically conducting adhesive.

2. Description of the Related Art

Referring, for example, to Japanese Unexamined Patent Publication (Kokai) No. 52-70369, a connection terminal portion of a substrate provided on a glass substrate which is a liquid crystal panel and a terminal portion of an external circuit substrate are electrically connected together by disposing an electrically conducting rubber between the connection terminal portion of the substrate and the terminal portion of the substrate for connection to an external circuit, involves problems in regard to the assembling operation efficiency since the electrically conducting rubber must be incorporated at a specified position and lack of stability in the contact between the electrically conducting material in the electrically conducting rubber and the terminal portions.

In order to solve the above-mentioned problems, therefore, there has been proposed technology which uses an anisotropic electrically conducting adhesive containing electrically conducting particles instead of using an electrically conducting rubber.

As for means of using an isotropic electrically conducting adhesive disclosed in the aforementioned Japanese Unexamined Patent Publication (Kokai) No. 52-70369, furthermore, Japanese Unexamined Patent Publication (Kokai) No. 58-115779 discloses, by way of numerical figures, a concrete example of electrically connecting a connection terminal portion of a substrate and a terminal portion of an external circuit substrate by using an anisotropic electrically conducting film.

In order to impart electric conduction to parts having low heat resistance such as liquid crystal panels and the like, an anisotropic electrically conducting adhesive has been much used in recent years as taught by the aforementioned prior art. Referring, for instance, to FIGS. 7 and 8 which are diagrams explaining the prior art, electrodes 33 and electrodes 41 are formed on the facing surfaces of a pair of substrates 30 and 40 that are disposed in facing manner, a connection terminal portion 31 of the electrodes 33 and a connection terminal portion (not shown) of the electrodes 41 are disposed on the outside of a sealing portion 50, and liquid crystals are sealed inside the sealing portion 50 to constitute a liquid crystal display device.

A prior art will now be explained with reference to FIGS. 8 and 9 which are views of a liquid crystal display device along the line A—A of FIG. 7. In FIGS. 8 and 9 which are sectional views along the line A—A of FIG. 7 of prior art, on the upper surface of the substrate 32 constituting the liquid crystal display device is disposed a connection terminal portion 31 that electrically couples the liquid crystal panel and the external circuit together, and the electrode composed of an indium tin oxide (ITO) film is disposed on the connection terminal portion 31 and on the pixel unit of the liquid crystal panel in which the liquid crystals are filled. Furthermore, a film-like electrically conducting sheet (hereinafter referred to as FPC) 10 is arranged facing the connection terminal portion 31 of the substrate 30.

Note that the FPC is usually formed in a film like configuration and thus it is generally used as an adhesive material, by being inserted into a space formed between two opposite electrodes. The FPC 10 is obtained by forming a copper pattern 13 which is an electrically conducting wiring pattern of copper or the like on a base film composed of a polyimide or the like, and applying a film of solder or tin of a thickness of 4 to 6 $\mu$m onto the copper pattern 13 by electroplating. A portion constituted by the electrically conducting film 14 and the copper pattern 13 of FPC 10 facing the connection terminal portion 31 of the substrate 32 is referred to as connection terminal portion 11. The connection terminal portion 11 and the connection terminal portion 31 are disposed facing each other with an anisotropic electrically conducting adhesive 20 which is an anisotropic electrically conducting film being disposed therebetween. The anisotropic electrically conducting adhesive 20 is constituted mainly by electrically conducting particles 21 and a resin binder 22. In general, the electrically conducting particles 21 comprise beads made of epoxy resin or polystyrene resin, and plated with nickel and gold, and the resin 22, in general, is an epoxy resin.

When a conventional anisotropic electrically conducting adhesive, e.g., CP7131, produced by Sony Chemical Co. is used, the electrically-conducting particles having an average diameter of about 6 $\mu$m, and the thickness of the anisotropic electrically conducting adhesive 20 before being adhered with the application of heat and pressure is about 25 $\mu$m. On the other hand, the copper pattern 13 at the terminal portion 11 disposed on the FPC 10 has a thickness of 35 $\mu$m, and the electrically conducting film 14 formed on the copper pattern 13 has a thickness of about 6 $\mu$m. Moreover, the connection terminal portion 33 disposed on the substrate 30 is composed of ITO.

Here, the anisotropic electrically conducting adhesive 20 that has heretofore been used for accomplishing electric connection comprises, for example, an epoxy resin as a main component, the epoxy resin being mixed with capsules containing a suitable curing agent and being further mixed with hard electrically conducting particles such as the aforementioned resin beads. The anisotropic electrically conducting agent 20 is filled in a gap between the two facing connection portions, for example, between the electrodes. When the anisotropic electrically conducting agent 20 is treated with the application of heat of a temperature of, for example, 170 to 180° C. and a pressure of, for example, 40 kg/cm$^2$ in a direction in which the length of gap formed between the pair of facing electrodes decreases, then, the capsules are destroyed, the curing agent is cured upon reacting with the epoxy resin that is the chief component of the adhesive agent. As a result, the electrically conducting particles and the two electrodes are connected to each other, establishing the electric connection in only a direction in which the pressure is applied.

When the thermosetting resin such as the epoxy resin or the like is cured, thermal energy or ultra-violet radiation can also be used so as to cure the thermosetting resin, instead of the above-mentioned capsules.

According to the above-mentioned prior art as shown in FIG. 8, adhesion is accomplished with the application of heat and pressure from the direction of arrow Y in order to accomplish the electric conduction between the connection terminal portion 31 of the substrate 30 and the connection terminal portion 11 of the FPC 10 via the electrically conducting particles 21 and to firmly adhere the FPC 10 and the substrate 30 together. Being adhered with the application of heat and pressure, the resin moves toward the direction where the internal pressure is low between the FPC 10 and the substrate 30. Here, the electrically conducting particles 21 have poor fluidity and change their positions little and remain between the electrically conducting film 14 of the connection terminal portion 11 and the ITO 33 disposed on the connection terminal portion 31 thereby to establish electric conduction between the electrically conducting film 14 and the ITO 33. However, the present inventors have found the fact that when the adhesion is accomplished with the application of heat and pressure from the direction of arrow Y in FIG. 8, the electrically conducting particles 21 are buried in the electrically conducting film 14 as shown in FIG. 9 since the electrically conducting film 14 of FPC 10 is composed of a solder or a tin film having a thickness of about 6 $\mu$m, the electrically conducting particles 21 have an outer diameter of about 6 $\mu$m, and the ITO 33 of the substrate 10 is composed of indite tin oxide. Accordingly, the electrically conducting particles lose their action to a conspicuous decree, whereby the conduction resistance increases and Door conduction occurs causing the conduction to be interrupted.

When a connection terminal portion 20 of a data processing circuit 40, for example a liquid crystal display device, including electrodes 33 and 41 and a suitable connection terminal 10 connected to an external control circuit (not shown) are connected together according to the prior art as shown in FIGS. 7 to 9, a digital control signal is fed from the control circuit to the connection terminal portion 20 of the data processing circuit 40 via the connection terminal 10, and ON or OFF level of the digital signal can be discriminated even when the connection resistance of the connection portion is high to some extent. In the field of liquid crystal technology in recent years, however, a data transfer device has been developed in which a data processing circuit and a drive circuit means for driving the data processing circuit are formed on the same glass substrate. In such a data transfer device, a signal for controlling the drive circuit means is, in many cases, an analog signal that is input from a control circuit outside the glass substrate via wiring.

In the above-mentioned data transfer device, therefore, it becomes difficult to reliably and correctly discriminate a change in the analog signal unless the resistance is decreased in the connection portion between the control circuit and the drive circuit means. It has, therefore, been desired to decrease the connection resistance.

On the other hand, in a liquid crystal display panel called a chip on glass (COG) type panel, in which an integral circuit (IC), for driving the liquid crystal display panel, is mounted on a transparent substrate of the panel, electrical power for driving the IC should be applied to the connecting terminal portions and thus a large amount of current may flow through the connecting terminal portions connected to the power source. Therefore, it is naturally required that the connection resistance should be reduce as much as possible.

SUMMARY OF THE INVENTION

The object of the present invention is to provide an electrically connecting structure which is free from defects inherent in the above-mentioned prior art, is simple in constitution, and reliably executes a connection, the electrically connecting structure being capable of maintaining a low connection resistance at the connection portion.

In order to accomplish the above-mentioned object, the electrically connecting structure according to the present invention basically employs the constitution that is described below.

That is, in a data transfer device constituted by, at least, a data processing circuit equipped with a plurality of electrically conducting terminal groups and a drive circuit means connected to a plurality of electrically conducting terminals in the data transfer device, an electrically connecting structure characterized in that a connection portion is formed between the facing connection terminal portions of the circuits or between the connection terminal portion of the circuit and the connection terminal portion of an external input circuit means facing thereto, the connection portion having space formed by the two facing electrodes which is filled with an anisotropic electrically conducting adhesive containing electrically conducting particles, the surface of at least one of the electrodes being coated with an electrically conducting film, an electrically conducting passage being formed between the two facing electrodes directly by said electrically conducting particles or by an indirect junction via the electrically conducting film, and the total thickness of the electrically conducting films being smaller than the minimum diameter of the electrically conducting particles. More concretely speaking, the invention is concerned with a data transfer device such as a liquid crystal display device, for example, in which, at least, a data processing circuit equipped with a plurality of electrically conducting terminal groups and a drive circuit means which connects to a plurality of electrically conducting terminals in the data transfer circuit, are formed on the same glass substrate, wherein an electrically connecting structure is characterized in that a connection portion is formed between the facing connection terminal portions of the circuits or between the connection terminal portion of the circuit and the connection terminal portion of an external input circuit means facing thereto, the connection portion having space formed by the two facing electrodes and is filled with an anisotropic electrically conducting adhesive containing electrically conducting particles, the surface of at least one of the electrodes being coated with an electrically conducting film, an electrically conducting passage being formed between the two facing electrodes directly by said electrically conducting particles or by an indirect junction via the electrically conducting film, and the total thickness of the electrically conducting films being smaller than the minimum diameter of the electrically conducting particles.

BRIEF DESCRIPTION OF THE DRAWINGS

FIG. 1(B) is a sectional view illustrating another example of the first embodiment as mentioned above;

DETAILED DESCRIPTION OF THE PREFERRED EMBODIMENTS

The electrically connecting structure and the method of fabrication thereof according to the present invention will now be described in detail by way of embodiments with reference to the drawings.

Figure 1A:
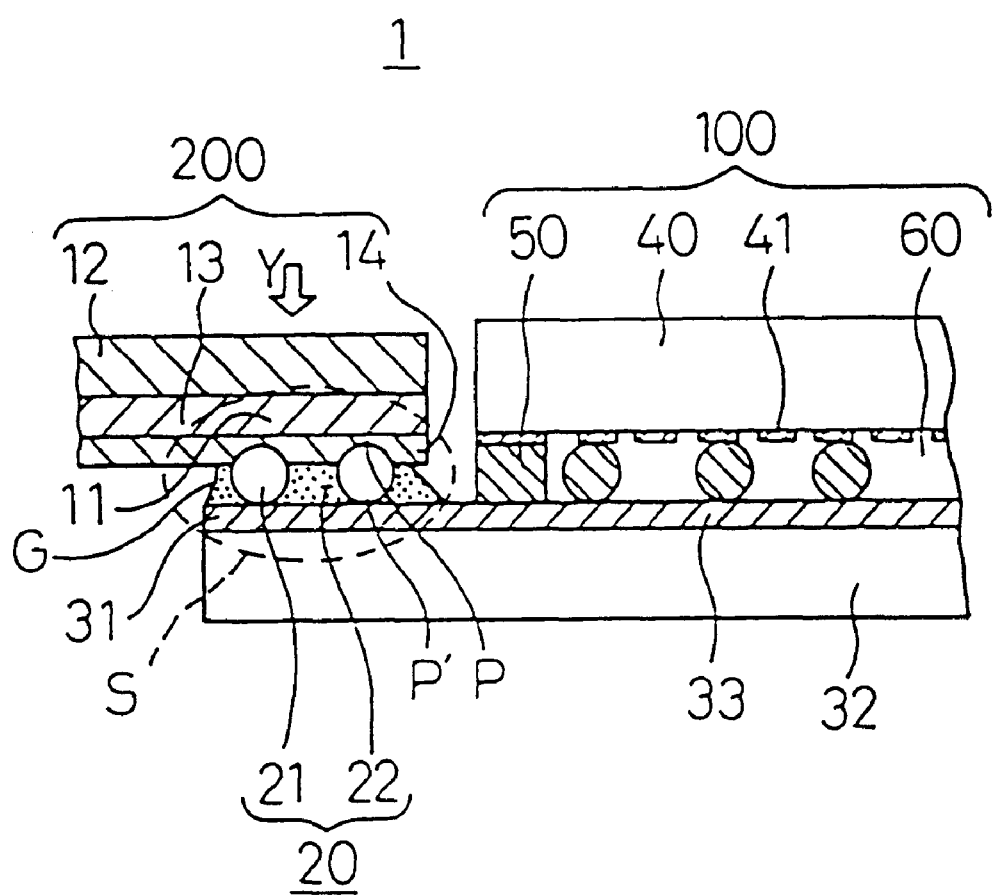
FIG. 1(A) is a sectional view illustrating a first embodiment of the present invention.

FIG. 1(A) is a sectional view illustrating a concrete constitution of an electrically connecting structure according to the present invention. That is, in a data transfer device 1 constituted by, at least, a data processing circuit 100 having a connection portion 20 equipped with a plurality of electrically conducting terminal groups 31 and a drive circuit means 200 which is connected to the terminals 31 and separately selects a plurality of electrically conducting terminals 31 in the data processing circuit 100 and sends predetermined signals to said data processing circuit 100, and electrically connecting structure is characterized in that a connection portion S is formed between the facing connection terminal portions 13 and 31 of the circuits 100 and 200. The connection portion S having a gap G formed by the two facing electrodes 31 and 13 and is filled with an anisotropic electrically conducting adhesive 22 containing a plurality of electrically conducting particles 21, the surface of at least one of the electrodes, e.g., the electrode 13 being coated with an electrically conducting film 14, an electrically conducting passage being formed between the two facing electrodes 31 and 13 directly by said electrically conducting particles 21 or indirectly by junctions P, P' via the electrically conducting film 14, and the total thickness of the electrically conducting film 14 being smaller than the minimum diameter of the electrically conducting particles 21.

According to the present invention, furthermore, the data processing circuit 100 and the drive circuit 200 may be formed on the same glass substrate 32, or they are mounted on a separate glass substrate, respectively.

In the structure of the present invention in which the first substrate 32 having a connection terminal portion 20 and the second substrate for example, FPC including IC or the like 12, having a connection terminal portion 200, different from the first substrate, are connected to each other using the anisotropic electrically conducting adhesive 22 containing electrically conducting particles 21, the electrically conducting film 14 provided for the first substrate 32 or for the second substrate 12 or for any one of the connection terminals, i.e., electrodes 13, 31 has a thickness, i.e., the electrically conducting film 14 provided for the electrodes of the part has a thickness which is smaller than the diameter of the electrically conducting particles 21.

Desirably, furthermore, the electrically conducting terminal 31 of the first substrate 32 is composed of ITO, the electrically conducting particles 21 contained in the anisotropic electrically conducting adhesive 22 provided on the ITO has an average diameter of about 5 $\mu$m, the connection terminal portions 13, 31 of the second substrate 200, or the control circuit for example; IC, arranged being opposed via the anisotropic electrically conducting adhesive 22 forms a copper pattern on the substrate, and the electrically conducting film of a solder or tin is formed on the copper pattern by the chemistry of electroless plating or the electroplating maintaining an average thickness of from about 1 $\mu$m to about 3 $\mu$m.

According to the present invention, the electrically conducting particles 21 in the anisotropic electrically conducting adhesive agent 22 have a diameter that is larger than the thickness of the connection terminal portion of the substrate to which the electrically conducting connection is to be made or larger than the thickness of the connection terminal portion of the part to which the electrically conducting connection is to be made, so that the electrically conducting particles are prevented from being buried in the connection terminals and that the electric conduction is accomplished stably and reliably between the connection terminal portion of the substrate and the connection terminal portion of the part to which the electrically conducting connection is made.

By forming the electrically conducting film having a thickness of from 1 to 3 $\mu$m by the chemistry of electroless plating method or the electroplating method furthermore, electrically conducting connection is favorably obtained with respect to the electrically conducting particles having an outer diameter of 6 $\mu$m.

FIG. 1(B) is a sectional view illustrating a concrete constitution of an electrically connecting structure of another embodiment of the present invention. That is, in a data transfer device 1 constituted by, at least, a data processing circuit 100 having a connection portion 20 equipped with a plurality of electrically conducting terminal groups 31 and a drive circuit means, for example IC, 200 which is mounted on the same glass transparent substrate 32 and separately selects a plurality of electrically conducting terminals 31 in the data transfer circuit 100 and sends predetermined signals to said data processing circuit 100, an electrically connecting structure $S_1$ is characterized in that a connection portion $S_1$ is formed between the facing connection terminal portions 13 and 31 of the circuits 100 and the driving circuit 200. On the other hand, another connecting structure $S_2$ is formed between the connection terminal portion 13' of the circuit 200 and the connection terminal portion 45 formed on the surface of the substrate 32 facing thereto.

At the other end of the electrode 45, a separate connection portion $S_3$ is formed between the electrode 45 and one end portion of an electrode 48 arranged on a surface of a separate substrate 250, for example, the FPC or the like, oppositely arranged to the substrate 32.

Further, in this embodiment, the another end of the electrode 48 formed on the FPC 250 is connected to one end of an electrode 47 which is formed on a substrate 36 separately arranged from the substrate 32 to form another separate connection portion $S_4$.

Note that the electrode 47 formed on a substrate 36, is connected to a central controlling mean 300 for controlling, for example, the IC 200.

In this embodiment, all of the connection portions $S_1$ to $S_4$ have the same constructions as to each other and each is identical to the connection portion S as indicated in FIG. 1(A).

Figure 7:
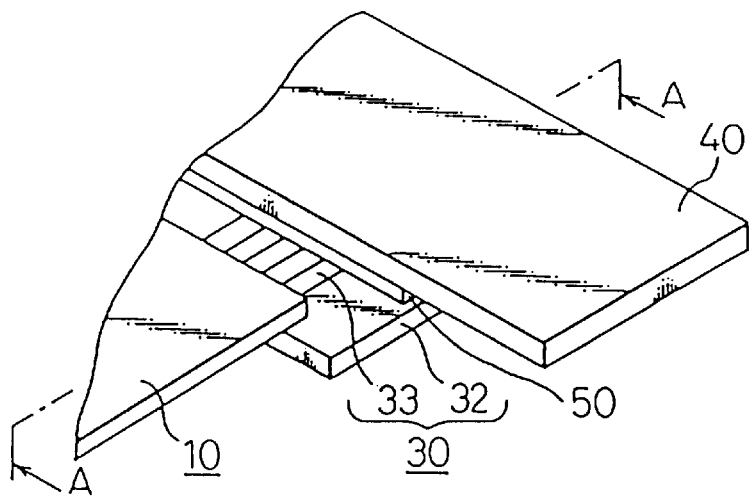
FIG. 7 is a diagram showing the appearance of a liquid crystal display device.
Figure 8:
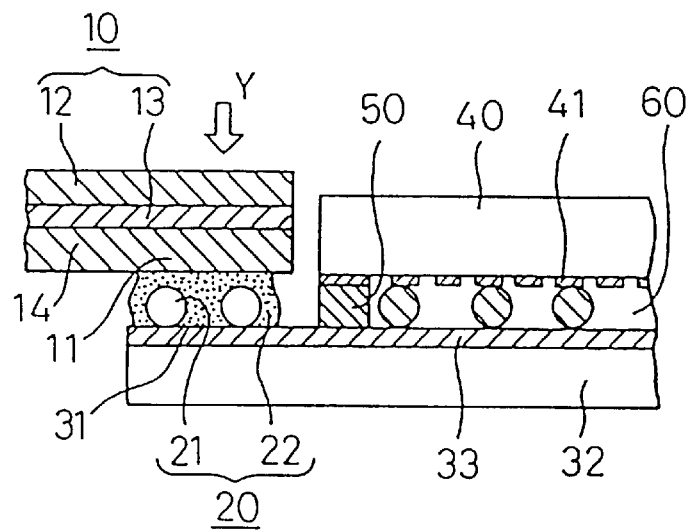
FIG. 8 is a sectional view of before the connection is accomplished by the application of heat and pressure according to a prior art.
Figure 9:
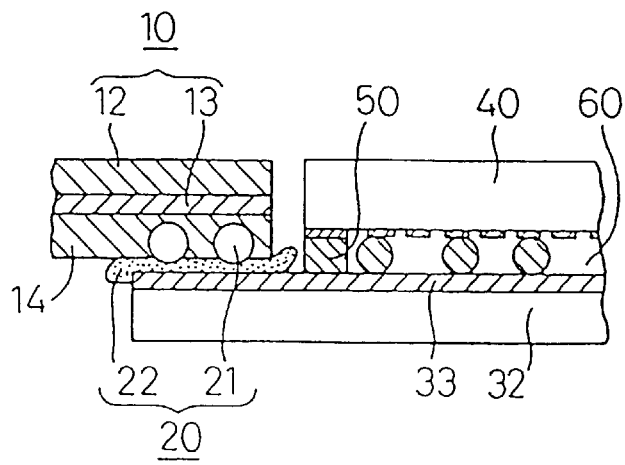
FIG. 9 is a sectional view of after the connection is accomplished by the application of heat and pressure according to the prior art.

Referring to FIG. 8 illustrating a conventional connection portion in which, for example, the FPC is adhered to the liquid crystal display device using an anisotropic electrically conducting adhesive as explained in the prior art with reference to FIG. 7, electrodes 33 and 41 are formed on the opposing surfaces of the pair of substrates 32 to 40 that are disposed facing each other, the connection terminal portion 31 of the electrode 33 and the connection terminal portion (not shown) of the electrode 41 are disposed on the outside of the sealing portion 50, and liquid crystals 60 are sealed inside the sealing portion 50 to constitute a liquid crystal display device.

A first embodiment of the present invention is illustrated in FIG. 1(A) which is a sectional view along the line A—A of FIG. 7. In FIG. 1(A), the FPC 200 is obtained by providing a copper pattern 13 of a thickness of 35 μm on the surface of a base film 12 of a polyimide having a thickness of about 25 μm on the side to which the electrically conducting adhesive is to be adhered and by forming an electrically conducting film 14 of a solder or tin having a thickness of 1 to 3 μm on the copper pattern 13 by the chemistry of electroless plating or the electroplating.

Figure 11A:
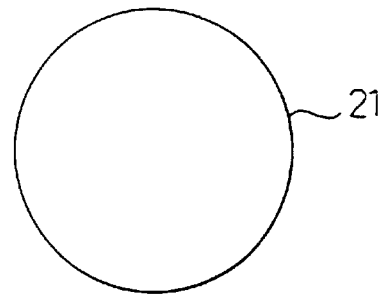
FIGS. 11(A) and (B) are cross-sectional views of the electrically conducting particle used in the present invention.

On the other hand, the electrically conducting adhesive 22 comprises an epoxy resin or polystyrene resin which contains electrically conducting particles 21 made of solder beads as shown in FIG. 11(A) or plastic beads 211 with a surface film 212 made of an electrically conducting material.

Figure 11B:
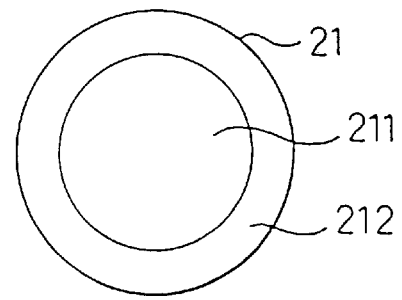

As shown in FIG. 11(A), the electrically conducting particles 21 are made of solder without having the surface film. On the other hand, as shown in FIG. 11(B) the particles 21 comprise the plastic beads 211 made of an epoxy resin or polystyrene resin and the surface thereof is covered with an electrically conducting layer 212 which is formed by plating nickel thereon and further plating gold on the surface of the nickel plating layer. As mentioned above, the copper pattern electrodes 13 are covered with the electrically conducting film 14 made of solder. The solder beads 21 as shown in FIG. 11(A) are also made of solder having the melted point being higher than that of the solder used in the film 14 to make the solder beads harder than the film 14.

Accordingly, the particles 21 have an outer diameter of about 6 μm.

The anisotropic electrically conducting adhesive 22 have a thickness of about 25 μm before it is adhered to the electrodes.

The substrate 32 is obtained by forming the ITO 33 maintaining a thickness of about 0.3 μm on a glass substrate having a thickness of about 1 mm.

Figure 2:
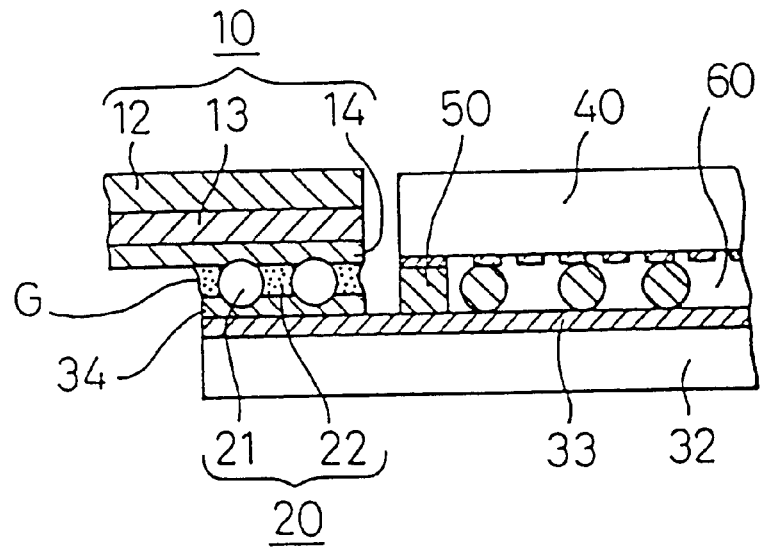
FIG. 2 is a sectional view illustrating a second embodiment of the present invention.

Described below is a method of adhering the FPC 10 as shown in FIG. 2, that corresponds to the second substrate 12 to the substrate 32 maintaining electric conduction. The FPC 10 having the anisotropic electrically conducting adhesive 22 applied onto the connection terminal portion 11 of the FPC 10 is so placed that the anisotropic electrically conducting adhesive 22 is superposed on the connection terminal portion 31 of the substrate 32. Here, a cradle composed of a bakelite or the like is disposed beneath the lower surface of the substrate 32, and the surface of the base film 12 is adhered by the application of heat and pressure from above the connection terminal portion 11 of the FPC 30 by using a heater as indicate by, arrow Y that is shown in FIG. 8.

Here, it is also allowable to employ a method of applying the pressure and heat by pushing up the heater from the lower side.

As shown in FIG. 2, the FPC. 10, electrically conducting adhesive 20 and substat 32 were adhered together maintaining electric conduction. The pressure was from 30 to 40 kg, the t temperature was from 170 to 180° C., and the heating time was from 10 to 15 seconds. The conduction resistance between the FPC 10 and the substrate 32 was about 1.5 Ω which was nearly one-half the resistance, about 3 Ω, of the prior art.

Note that, FIG. 2 illustrates a second embodiment of the present invention in which the electrically conducting film 14 is provided on the FPC 10 that is the second substrate 12, and an electrically conducting film 34 is formed on the ITO 33 of the substrate 32 that is disposed being opposed to the FPC 10 with the electrically conducting adhesive 22 being held therebetween.

In FIG. 2, the electrically conducting film 14 was formed by chemistry of electroless plating a solder or tin maintaining a thickness of from 1 to 3 μm, and the electrically conducting adhesive 22 containing electrically conducting particles 21 having a diameter of about 6 μm was used to stably obtain electrical connection in which the electrically conducting particles 21 were brought into contact with the electrically conducting film 14 of the FPC 10 and the electrically conducting film 34 of the electrodes 33 formed on substrate 32 as a result of the adhesion by the application of heat and pressure.

Figure 3:
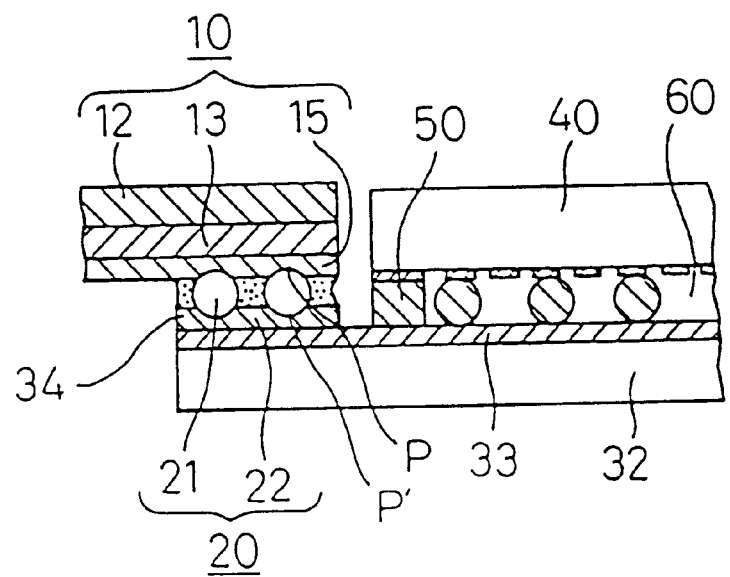
FIG. 3 is a sectional view illustrating a third embodiment of the present invention.

FIG. 3 illustrates a third embodiment of the present invention in which the copper pattern 13 is arranged on the base film 12 of the FPC 10, and is plated with gold maintaining a thickness of 0.03 μm or larger as a protective electrically conducting film 15 by flash plating in order to prevent the copper pattern 13 from being oxidized.

The electrically conducting film 34 of solder or tin was utilizing the chemistry of electroless plating method having a thickness of from 1 to 3 μm on the ITO 33 of the substrate 32 such that the electrically conducting particles 21 contained in the electrically conducting adhesive 22 were prevented from being buried in the electrically conducting films 34 and 15. Besides, the electric conduction between the copper pattern 13 and the ITO 33 is improved by the protective electrically conducting film 15.

Figure 4:
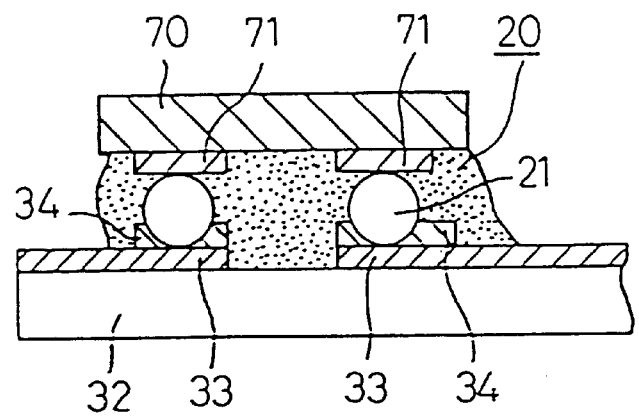
FIG. 4 is a sectional view illustrating a fourth embodiment of the present invention.

FIG. 4 illustrates a fourth embodiment of the present invention in which, unlike the FPC explained above, the present invention is adapted to electrically connecting parts such as ICs to the electrically conducting pattern on the substrate by using the electrically conducting adhesive 22 which has been utilized in a variety of fields in recent years. FIG. 4 illustrates the embodiment in which an IC chip 70 that is a part is die-bonded to the substrate 32.

In FIG. 4, the electrically conducting film 34 of solder or tin is plated utilizing the chemistry of electroless plating method, maintaining a thickness of 1 to 3 μm on the ITO 33 on the substrate 32 to prevent the electrically conducting particles 21 in the electrically conducting adhesive 22 from being buried in the electrically conducting film 34 and to improve electric conduction between the electrode 71 including an electrode made of chromium or copper or bump electrodes, and the ITO 33.

Figure 5:
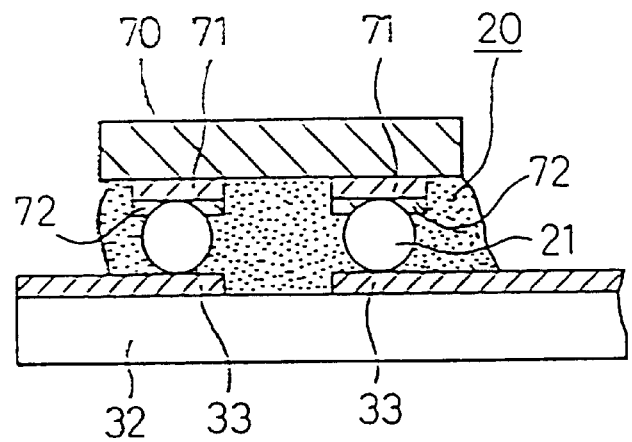
FIG. 5 is a sectional view illustrating a fifth embodiment of the present invention.

FIG. 5 illustrates a fifth embodiment of the present invention in which the IC chip 70 which is a part is die-bonded with an adhesive onto the substrate 32.

In FIG. 5, an electrically conducting film 72 of solder or tin is plated utilizing the chemistry of electroless plating method and maintaining a thickness of from 1 to 3 μm on the bump electrodes 71 of the IC chip 70. The IC chip 70 is then die-bonded with an adhesive onto the substrate 32 preventing the electrically conducting particles 21 from being buried in the electrically conducting film 72 and improving the electric conduction between the bump electrodes 71 and the ITO 33.

Figure 6:
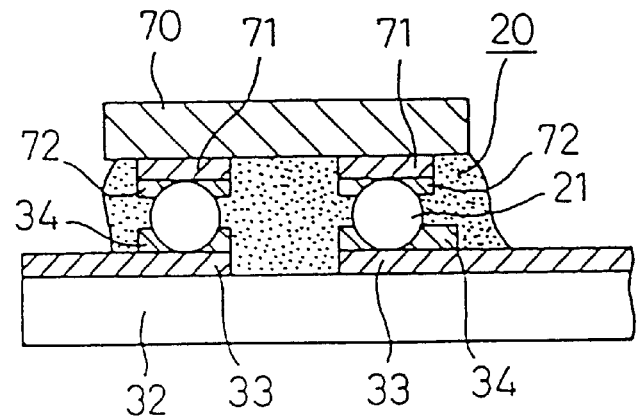
FIG. 6 is a sectional view illustrating a sixth embodiment of the present invention.

FIG. 6 illustrates a sixth embodiment of the present invention wherein the IC chip 70 that is a part is die-bonded with an adhesive onto the substrate 32.

In FIG. 6, the electrically conducting film 72 of solder or tin is plated utilizing the chemistry of electroless plating method and maintaining a thickness of from 1 to 3 μm onto the bump electrodes 71 of the IC chip 70, and the electrically conducting film 34 of solder or tin is plated utilizing the chemistry of electroless plating method and maintaining a thickness of from 1 to 3 μm on the ITO 33 of the substrate 32. Then, an electrically conducting adhesive is held between the electrically conducting film 34 and the electrically conducting film 72 to accomplish the die-bonding. The electrically conducting particles 21 of the electrically conducting adhesive 20 are prevented from being buried in the electrically conducting films 34 and 72, and the electric conduction is improved between the bump electrodes 71 and the ITO 33.

In the electrically connecting structure 1 of the present invention as described above, it is desired that the electrically conducting films 14, 14', 49 and 72 are formed on the surfaces of the opposing electrodes 13 and 31, or 33 and 71, or 13' and 45, or 45 and 48 or 48 and 47.

In the electrically connecting structure 1 of the present invention, furthermore, the total thickness of the electrically conducting films 14, 14', 49 and 72 formed on the surfaces of the facing electrodes 13 and 31, or 33 and 71, or 13' and 45, or 45 and 48 or 48 and 47, must be smaller than the minimum diameter of the electrically conducting particles 21.

According to the electrically connecting structure 1 of the present invention which is subjected to a high pressure and a high temperature as described above, the electrically conducting particles 21 are partly fitted into the electrically conducting films 14, 14', 49 and 72 to form a point contact between the electrically conducting particles 21 and the electrically conducting films 14, 14', 49 and 72, which, then, constitutes part of the electrically conducting passage.

In the electrically connecting structure 1 of the present invention, the electrically conducting particles 21 are made of hard solder beads, the hardness thereof is higher than that of the film 14 or are composed of plastic resin beads made of a hard material such as an epoxy resin or polystyrene resin, and are deformed to some extent by the application of the pressure compared to the initial shape between the electrodes in the connection portion S in the completed electrically connecting structure 1. The electrically conducting particles 21, however, exist between the facing electrodes without being crushed. Unlike the prior art, therefore, the electrically conducting particles 21 are not melted, are not substantially deformed to lose their original shapes, and are not pulverized.

According to the present invention, furthermore, the diameters of the electrically conducting particles 21 in a direction in which the electrodes are arranged determine the gap G between the electrodes of the connection portion S.

The connected configuration of the electrically connecting structure 1 formed between the electrode 13, 33, 31, 71 or 201 or electrically conducting film 14, 15, 34, or 72 and the electrically conducting particle 21, will be explained with reference to FIGS. 10, 11(A), 11(B), 12(A) and 12(B), hereunder.

Figure 10:
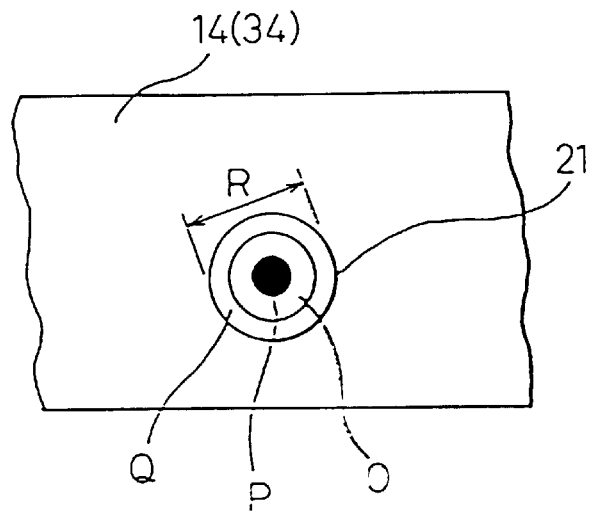
FIG. 10 is a diagram showing a connecting configuration of the electrically conducting film in the connection portion in the electrically connecting structure.
Figure 12A:
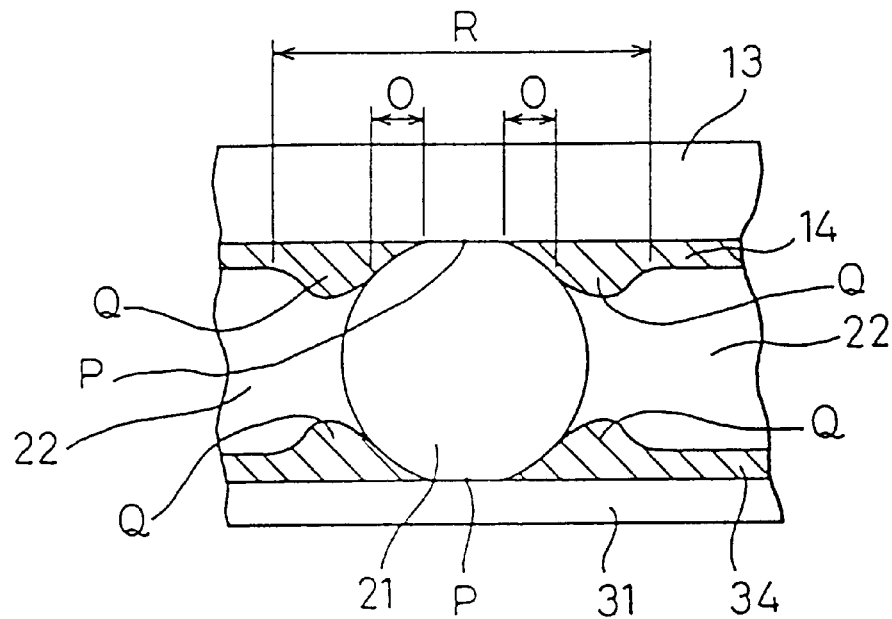
FIGS. 12(A) and (B) are enlarged cross-sectional views of a construction of the connecting portion of one embodiment of the present invention.

When the solder beads are used as the electrically conducting particle 21, as shown in FIG. 11(A), the connecting condition in the connection portion S in the electrically connecting structure 1 of the present invention, which is formed between the particle 21 and the electrode 13 with the electrically conducting film 14 or the electrode 31 with the electrically conducting film 34, is illustrated in FIGS. 10 and 12(A).

Note that FIG. 10 shows a plane view of the connection portion S in the electrically connecting structure 1, while FIG. 12(A) shows a cross sectional view of the connection portion S.

Figure 13:
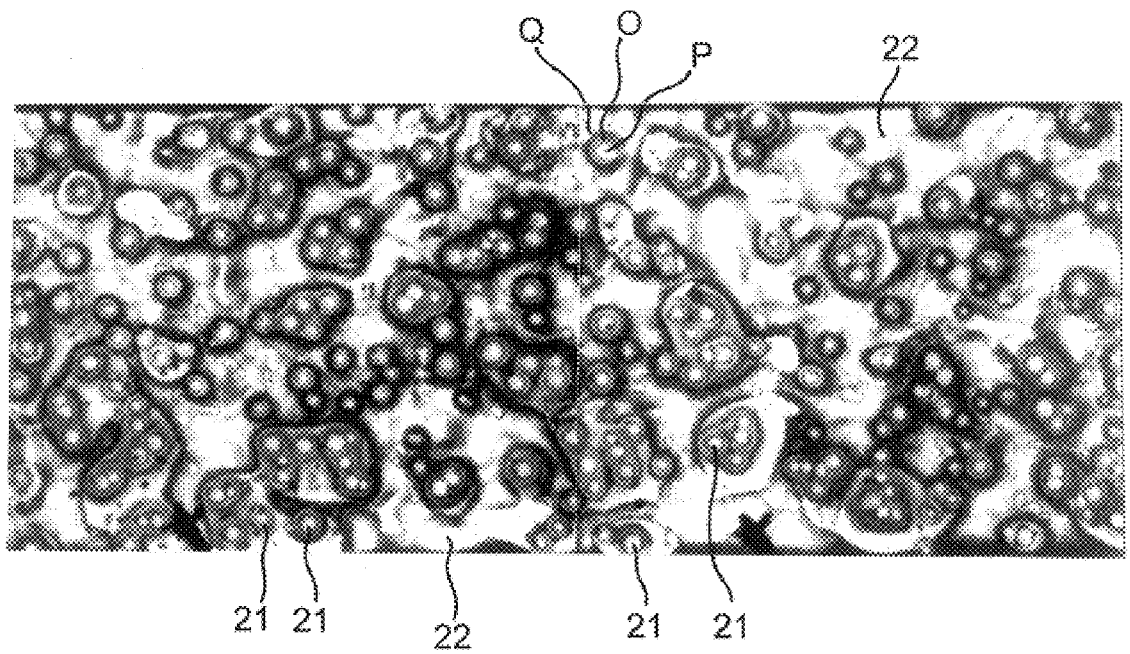
FIG. 13 is an enlarged photograph showing a plane view of the connecting portion of the present invention which is formed by FPC after removing the electrode.

The applicant assumes that the cross-sectional view of the connection terminal portion of the present invention would probably show a configuration as shown in FIG. 12(A), for example, taking the configuration of the photograph as shown in FIG. 13, into account.

From FIG. 10, it will be understood that the electrically conducting particles 21 made of solder, the hardness and melting point of which being higher than those of the solder forming the electrically conducting film 14, and dispersed in the anisotropic electrically adhesive film or resin binder 22, are partly contacted to the electrode 13 at a narrow point P through the electrically conducting film 14, which is made of solder.

And in FIG. 10, simultaneously a ring-like portion O surrounding the above-mentioned portion P, is formed and which denotes a part of the electrically conducting film 14 having a thin thickness.

As understood from FIGS. 10 and 12(A), at an outer peripheral portion of the ring-like portion O, there is provided another ring-like portion Q having a diameter R.

The ring-like portion Q shows a ring-like deformed portion of the electrically conducting film 14 which is formed due to a pressing force applied to the electrically conducting film 14 caused by the conducting particle 21 during the heating and the pressing treatment.

FIG. 13 shows a plane view similar to FIG. 10, which is illustrating an actual configuration of the connecting portion between an electrode 13 and the particles 21 dispersed in the resin binder 22.

As apparent from FIG. 13, a plurality of the electrically conducting particle 21 are dispersed in the resin binder 22 and each one of the particles 21 has a center portion P indicating a portion at which the electrode 14 and a top surface of the particle 21, made of solder, for example, while a ring-like portion O which is surrounding the center portion P.

In accordance with this configuration of the present invention, the particles 21 and the electrode 13 are strongly brought into contacting to each other so that the conduction resistance can be reduced.

Figure 12B:
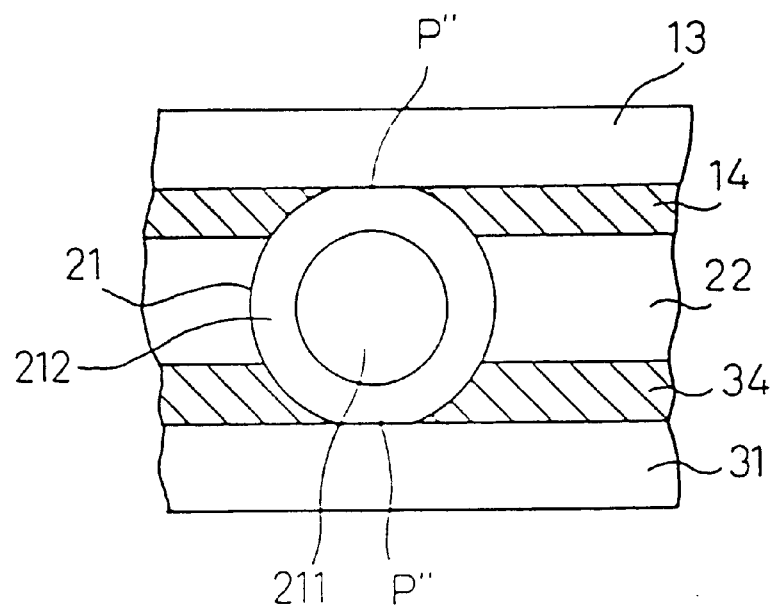

On the other hand, when the particle 211 made of the plastic beads with an electrically conducting film 212 as shown in FIG. 11(B), are used as the electrically conducting particle 21, the connecting condition in the connection portion S in the electrically connecting structure 1 of the present invention, is shown in FIG. 12(B).

In this embodiment, although the connection portion S is formed between the particle 21 and the electrode 13 with the electrically conducting film 14 or the electrode 31 with the electrically conducting film 34, a top portion of the electrically conducting film 212 of the particle 211 contacts to the electrode 13 at a narrow point P" through the electrically conducting film 14, which is made of solder.

And the top portion of the electrically conducting film 212 of the particle 211 is deformed due to a strong pressure force applied thereto so as to form an electric path between the electrodes 13 and 31 through the electrically conducting film 212.

However, in this embodiment, the electrically conducting film 14 is not deformed to form a projected portion like the one as shown in FIG. 12(A).

It is desired that the electrodes 31, 33, 13 and 71 of the present invention are made of a material selected from indium tin oxide and the like.

According to the present invention, the electrically conducting films 14, 14', 49 and 72 should be constituted by a material selected from solder, tin, nickel, gold, tantalum pentoxide and the like. The electrically conducting films 14, 15, 34 and 72 are formed by the electroplating method or the chemistry of electroless plating method.

In the above-mentioned examples of the present invention, it is further desired that a diameter of the core portion 211 of the particles 21 dispersed in the anisotropic electrically conducting resin binder 22, may be 5±1.5 µm and the total diameter thereof including the electrically conduction film 212 formed on the surface of the core portion 211, or solder beads may be 6±2 µm.

On the other hand, a ratio of a distribution area of the particles 21 to a predetermined area may be 5 to 20%.

Described below is a method of forming the electrically connecting structure 1 according to the present invention. That is, in forming a connection portion between the facing connection terminal portions of the circuits or between a connection terminal portion of the circuit and a connection terminal portion of a suitable external input circuit means facing thereto in a data transfer device constituted by, at least, a data processing circuit equipped with a plurality of electrically conducting terminal groups and a drive circuit means connected to a plurality of electrically conducting terminals in the data transfer circuit and sends predetermined signals to said data processing circuit, a method of forming an electrically connecting structure comprising:

- a step for preparing a film-like anisotropic electrically conducting adhesive containing electrically conducting particles having diameters larger than a thickness of an electrically conducting film disposed on a surface of electrodes and applying it at a portion on which a connection terminal portion will be formed;
- a step for disposing the electrodes of said connection portion in a manner facing each other and forming space between said electrodes;
- a step for covering the surface of the electrodes of at least one side of the connection portion with an electrically conducting film having a predetermined thickness;
- a step for adjusting the gap of said space in the connection portion by subjecting said connection portion to the application of heat and pressure, so that the facing electrodes come into direct contact with said electrically conducting particles or come into indirect contact with said electrically conducting particles via said electrically conducting film.

According to the present invention, it is desired that the electrically conducting particles 21 have an average diameter of about 5 µm, and the electrically conducting films 14, 14', 49 and 72 formed on the surfaces of the electrodes have a thickness of from 1 to 3 µm.

According to the present invention, the electrically conducting particles that are contained in the anisotropic electrically conducting agent to exhibit the action of adhesion while offering electric conduction, are not buried in the electrically conducting films during the adhesion with the application of heat and pressure, and exhibit their function efficiently without losing the electric conduction. There is thus obtained stable and reliable electric conduction.

Moreover, the electrically conducting film of solder or tin that is formed by the chemistry of electroless plating helps obtain the product at a reduced cost yet offering improved reliability.

We claim:

1. A method of forming an electrical connection portion between opposing conductive terminals of circuits or between conductive terminals of a circuit and conductive terminals of external input circuit means in a data transfer device constituted at least by a data processing circuit equipped with a plurality of electrically conductive terminals and a drive circuit means connected to the plurality of electrically conductive terminals in the data processing circuit, the method of forming an electrical connection portion comprising the steps of:

covering a surface of the conductive terminals on at least one side of the connection portion with an electrically conductive film having a predetermined thickness;

preparing a film-like anisotropic electrically conductive adhesive containing electrically conductive particles having diameters larger than the thickness of said electrically conductive film on the surface of the conductive terminals and applying the anisotropic electrically conductive adhesive to a portion of the conductive terminals on which the electrical connection portion will be formed;

positioning the conductive terminals at said connection portion to face each other with a gap therebetween; and adjusting the gap between the conductive terminals at the connection portion by subjecting said connection portion to application of heat and pressure, so that facing surfaces of the conductive terminals are spaced at least by the diameters of the conductive particles, and the facing conductive terminals come into direct contact with said electrically conductive particles or come into indirect contact with said electrically conductive particles via said electrically conductive film, but so that major portions of said electrically conductive particles project from said electrically conductive film.

2. The method of forming an electrical connection portion according to claim 1, wherein said electrically conducting particles have an average diameter of about 5 µm.

3. The method of forming an electrical connection portion according to claim 1, wherein the electrically conductive film formed on the surface of said conductive terminals has a thickness of from 1 to 3 µm.

* * * * *